United States Patent [19]

Terajima

[11] Patent Number: 5,527,992
[45] Date of Patent: Jun. 18, 1996

[54] CAVITY DOWN MOUNTING SEAM-WELDING CERAMIC PACKAGE FOR SEMICONDUCTOR DEVICE

[75] Inventor: Katsushi Terajima, Tokyo, Japan

[73] Assignee: NEC Corporation, Tokyo, Japan

[21] Appl. No.: 366,478

[22] Filed: Dec. 30, 1994

[30] Foreign Application Priority Data

Dec. 30, 1993  [JP]  Japan .................................. 5-353708

[51] Int. Cl.$^6$ ................................................. H01L 23/02
[52] U.S. Cl. ........................... 174/52.4; 29/843; 257/704
[58] Field of Search .................................. 174/52.1, 52.2, 174/52.3, 52.4; 29/860, 843; 257/704, 710

[56] References Cited

U.S. PATENT DOCUMENTS

| 4,015,071 | 3/1977 | Peet | 174/52.2 |
|---|---|---|---|
| 4,331,258 | 5/1982 | Geschwind | 220/359 |
| 4,551,745 | 11/1985 | Watanabe | 228/173.3 X |
| 5,117,068 | 5/1992 | Seieroe et al. | 174/52.4 |
| 5,268,533 | 12/1993 | Kovacs et al. | 174/52.4 |

FOREIGN PATENT DOCUMENTS

| 0154757 | 9/1985 | European Pat. Off. . | |
| 2313845 | 12/1976 | France . | |
| 57-172754 | 10/1982 | Japan . | |
| 59-231838 | 12/1984 | Japan . | |
| 5-144999 | 6/1993 | Japan . | |

OTHER PUBLICATIONS

R. Ilgenfritz et al., "Parallel-Seam Weld-Sealing of Large Multilayer Ceramic Packages", 22nd Electronic Components Conference, May 1972, pp. 416–425.

Primary Examiner—Kristine L. Kincaid
Assistant Examiner—Christopher Horgan
Attorney, Agent, or Firm—Young & Thompson

[57] ABSTRACT

A metal cap involved in a cavity down mounting package to be subjected to a seam welding with at least a roller electrode, wherein the metal cap has a square like external shape with four corners being so rounded that each corner has a radius of curvature in the range from 1/10 to 3/8 of a length on each side of the square like shaped metal cap thereby the seam welding is carried out by a combination of a straight movement of the roller electrode along straight sides of the metal cap and adjacent part of the rounded corners to the straight sides and a rotary movement of the roller electrode around a center axis of the metal cap and the roller electrode moves along the rounded corners except adjacent portions to the straight side of the metal cap.

6 Claims, 5 Drawing Sheets

| Size of metal cap and seal ring | | Maximum size | Placement area of leads and dead zone |
|---|---|---|---|
| Invention | 4-R7.0<br>27.4mm □ | 20mm □ | leads, cap, package |
| Prior Art | ⌀27.4mm □ | 15mm □ | cap |
| Priot Art | 27.4mm □ | 20mm □ | cap, dead zone |

FIG. 5

CAVITY DOWN MOUNTING SEAM-WELDING CERAMIC PACKAGE FOR SEMICONDUCTOR DEVICE

BACKGROUND OF THE INVENTION

The invention relates to a cavity down seam welding ceramic package for sealing a semiconductor device.

In the prior art, a cavity down ceramic package for a semiconductor device has utilized a solder sealing of a metal cap using an Au—Su soldering agent. However, in view of the low cost and a low temperature sealing as well as a reduction of pin holes of soldering being recently required, it has been on the consideration to use a seam welding for sealing the cavity down mounting ceramic package.

In FIGS. 1A and 1B, the conventional seam welding method for the ceramic package with a circular seal ring is illustrated, while in FIGS. 2A and 2B, the conventional seam welding method for the ceramic package with a square-shaped seal ring is illustrated. A ceramic package 1 has a cavity portion 1a at a center portion on a top surface thereof for mounting a semiconductor device. Outer leads 2 are provided in the form of a lattice with a pitch of 2.54 millimeters on a peripheral area of the top surface of the ceramic package 1. In the cavity portion 1a, a semiconductor device 3 is mounted. The semiconductor device has pads being connected to inner leads through bonding wires 7. The inner leads are connected to the outer leads 2 through interconnections.

On the peripheral area to the cavity portion 1a of the semiconductor device 3, a metallization layer is formed. A seal ring 4 made of Fe—Ni alloy or Kovar is brazed by Ag—Cu brasses on the metallization layer. The seal ring has a thickness of 0.5 millimeters and a width of 1 to 1.5 millimeters and a surface thereof is treated by Ni and Au gilding. A metal cap 5 is fixed on the seal ring 4 by the seam welding.

The metal cap 5 is made by punching of Ni gliding or Ni cladding Kovar material. The metal cap has a concave center portion in the seal ring 4 and a peripheral portion on the seal ring 4. The seam welding is carried out by rotation or motion of paired roller electrodes 6 in contact with the peripheral portion of the metal cap along the seal ring 4 during which a voltage of 3 V to 4 V and pulse currents of approximately 200 mA are applied to the roller electrodes 6. In case of the circular metal cap 5, the package is rotated one or half time around a center axis. In case of the square shaped metal cap 5, the package or the roller electrodes are moved in the straight and in relation to each other so that the roller electrodes 6 shows a motion with a rotation along first opposite sides of the square shaped metal cap 5 for subsequent rotation of the package by 90° and then the roller electrodes 6 rotates along second opposite sides of the square shaped metal cap 5. If the square metal cap 5 has rounded corners with a large curvature radius then it is difficult to cause a sufficient metal melting necessary for a secure sealing. For that reason, the curvature radius of the corners of the square metal cap 5 is preferably limited within 0.5 millimeters.

The above described rotary and parallel seam welding methods are engaged with the following problems in the rotary seam welding method as illustrated in FIGS. 1A and 1B, a size of the semiconductor device is largely limited by an external definition of the package 1 and a placement of the outer leads 2. A mounting area for the semiconductor device when use of the circular metal cap is smaller by 20 to 30 percent than that when use of the square metal cap. This means that the package with the circular metal cap has a larger unavailable area.

In the parallel seam welding method as illustrated in FIGS. 2A and 2B, it is required to provide dead zones on which no outer leads are provided for the motion of the roller electrodes 6 for the seam welding when the roller electrodes 6 is positioned on the corners of the square metal cap, then a half of each the roller electrode 6 extended around or outside of the square metal cap. For that reason, it is difficult to provide the outer leads 2 on the dead zones in the vicinity of the corners of the square metal cap, thereby resulting in the number of the outer leads being largely limited. When the roller electrode 6 has a width of 4 millimeter and a radius of 12 millimeter and a pitch of the outer leads is 2.54 millimeter, each dead zone may provide an elimination of 2×2 outer leads. Two of the dead zone are formed in the vicinity of each corner of the square metal cap. Then, eight of the dead zones are formed in the vicinity of the corners of the square metal cap thereby eliminating 32 outer leads.

SUMMARY OF THE INVENTION

Accordingly, it is an object of the present invention to provide a novel structure of a cavity down mounting seam welding ceramic package for semiconductor device, that is free from any problems as described above.

It is a further object of the present invention to provide a novel structure of a cavity down mounting seam welding ceramic package with a high packaging density.

It is a furthermore object of the present invention to provide a novel structure of a cavity down mounting seam welding ceramic package with large placement areas for semiconductor device and outer leads.

It is a still further object of the present invention to provide a novel structure of a metal cap involved in a cavity down mounting seam welding ceramic package for semiconductor device, that is free from any problems as described above.

It is yet a further object of the present invention to provide a novel structure of a metal cap involved in a cavity down mounting seam welding ceramic package with a high packaging density.

It is a moreover object of the present invention to provide a novel structure of a metal cap of a cavity down mounting seam welding ceramic package with large placement areas for semiconductor device and outer leads.

The above and other objects, features and advantages of the present invention will be apparent from the following descriptions.

The invention provides a cavity down mounting package to be subjected to a seam welding with at least a roller electrode, comprising a substrate with a cavity at its center portion for accommodating a semiconductor device, a plurality of outer leads being aligned in the form of matrix on a peripheral area of the cavity, a seal ring being provided on the peripheral area at a peripheral edge of the cavity, a metal cap having a peripheral portion being on the seal ring and being made into contact with roll electrodes used in the seam welding, the metal cap having a square like external shape with four corners being to rounded that each corner has a radius of curvature in the range from 1/10 to 3/8 of a length on each side of the square like shaped metal cap thereby the seam welding is carried out by a combination of a straight movement of the roller electrode along straight sides of the metal cap and adjacent part of the rounded corners to the straight sides and a rotary movement of the roller electrode around a center axis of the metal cap and the roller electrode moves along the rounded corners except adjacent portions to the straight side of the metal cap.

The invention also provides a metal cap involved in a cavity down mounting package to be subjected to a seam welding with at least a roller electrode, wherein the metal cap has a square like external shape with four corners being so rounded that each corner has a radius of curvature in the range from 1/10 to 3/8 of a length on each side of the square like shaped metal cap thereby the seam welding is carried out by a combination of a straight movement of the roller electrode along straight sides of the metal cap and adjacent part of the rounded corners to the straight sides and a rotary movement of the roller electrode around a center axis of the metal cap and the roller electrode moves along the rounded corners except adjacent portions to the straight side of the metal cap.

The radius of curvature is in the range from 2 to 10 millimeters. Alternatively, the radius of curvature is approximately equal to a quarter of the length on each side of the square like shaped metal cap.

BRIEF DESCRIPTIONS OF THE DRAWINGS

Preferred embodiments of the present invention will hereinafter fully be described in detail with reference to the accompanying drawings.

FIG. 5 is a plane view illustrative of dead zones of novel and conventional cavity down mounting seam welding ceramic packages.

PREFERRED EMBODIMENTS OF THE INVENTION

Figure 1A:
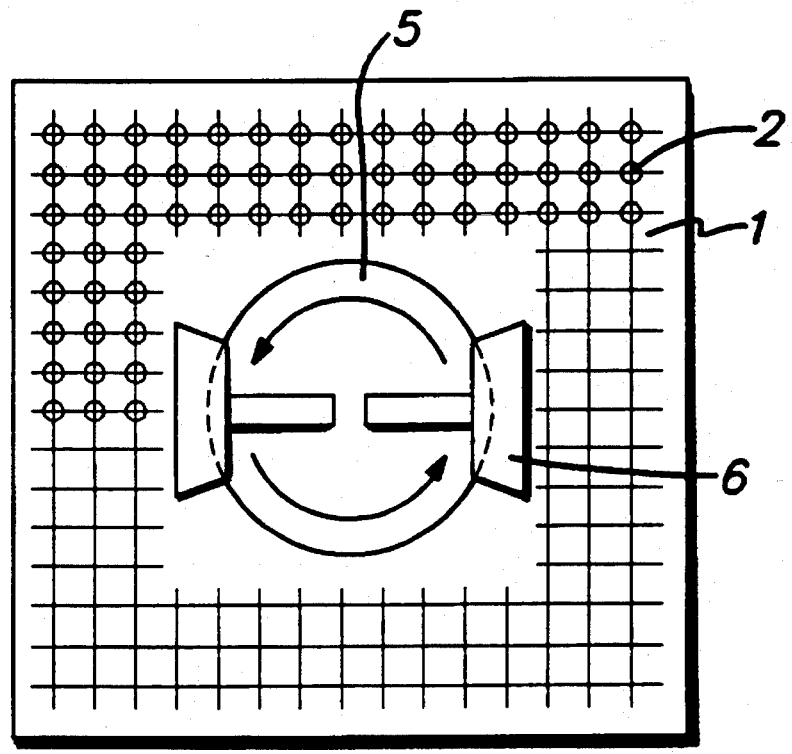
FIG. 1A is a plane view illustrative of the conventional rotary seam welding of the cavity down mounting ceramic package.
Figure 1B:
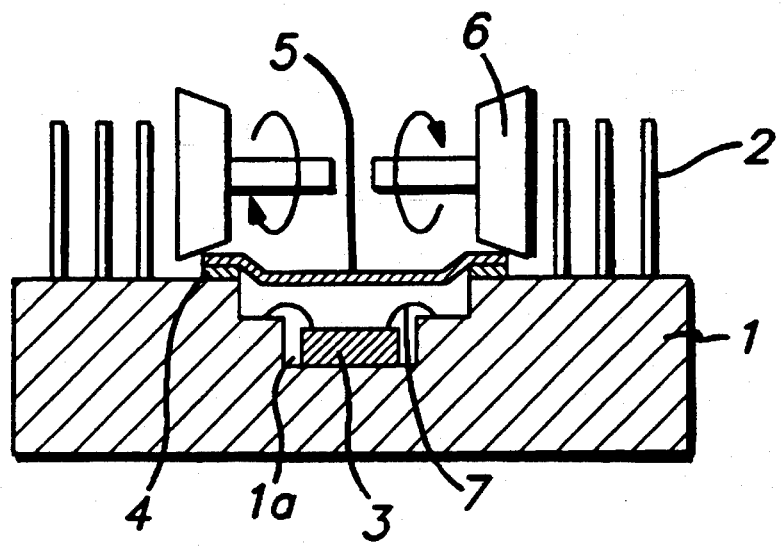
FIG. 1B is a cross sectional elevation view illustrative of the conventional rotary seam welding of the cavity down mounting ceramic package.
Figure 2A:
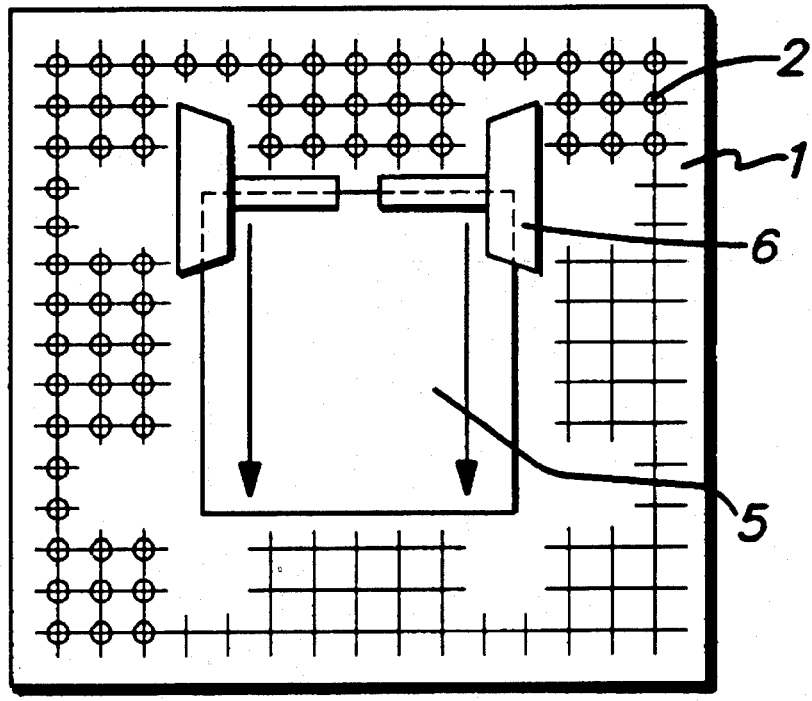
FIG. 2A is a plane view illustrative of the conventional parallel seam welding of the cavity down mounting ceramic package.
Figure 2B:
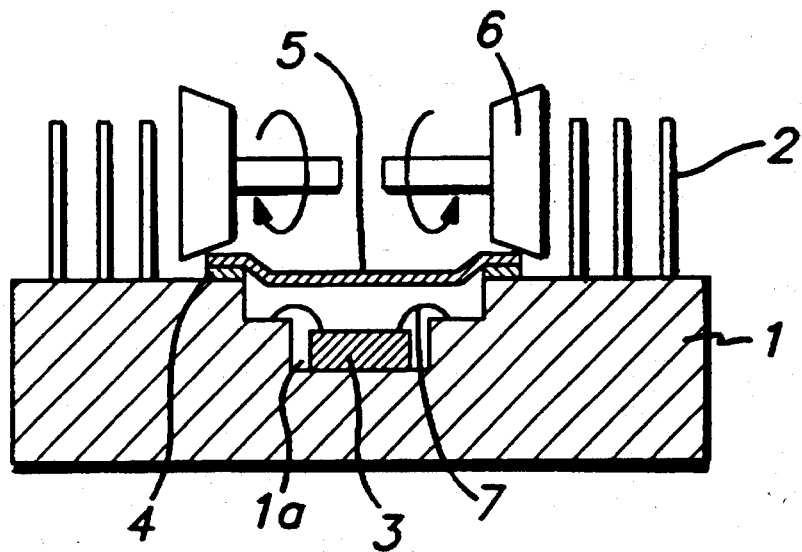
FIG. 2B is a cross sectional elevation view illustrative of the conventional parallel seam welding of the cavity down mounting ceramic package.
Figure 3A:
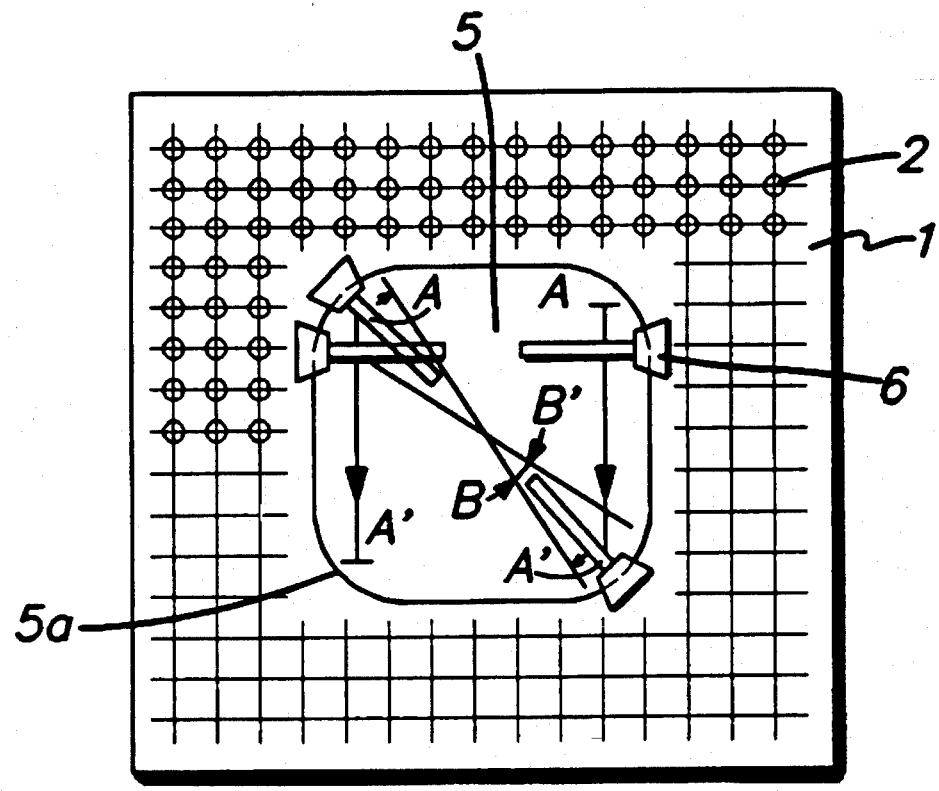
FIG. 3A is a plane view illustrative of a seam welding of a novel cavity down mounting ceramic package according to the present invention.
Figure 3B:
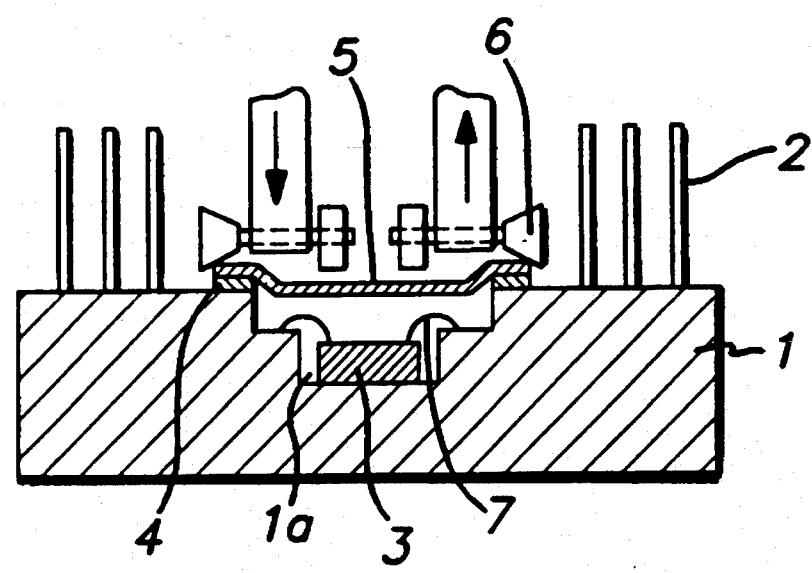
FIG. 3B is a cross sectional elevation view illustrative of a seam welding of a novel cavity down mounting ceramic package according to the present invention.

A preferred embodiment according to the present invention will be described in detail with reference to FIGS. 3A and 3B. A ceramic package 1 has a cavity portion 1a at a center portion on a top surface thereof for mounting a semiconductor device. Outer leads 2 are provided in the form of a lattice with a pitch of 2.54 millimeters on a peripheral area of the top surface of the ceramic package 1.

In the cavity portion 1a, a semiconductor device 3 is mounted. The semiconductor device has pads being connected to inner leads through bonding wires 7. The inner leads are connected to the outer leads 2 through interconnections.

On the peripheral area to the cavity portion 1a of the semiconductor device 3, a metallization layer such as tungsten silicide layer is formed. A seal ring 4 made of Kovar is brazed by Ag—Cu brasses on the metallization layer. The seal ring has a thickness of 0.5 millimeters and a width of 1 to 1.0 millimeters and a surface thereof is treated by Ni and Au gilding. A metal cap 5 is fixed on the seal ring 4 by the seam welding.

The metal cap 5 is made by punching of a Kovar plate whose opposite surfaces are cladded with Ni. The metal cap 5 has a concave center portion with a depth of 0.33 millimeters in the seal ring 4 and a peripheral portion with a width of 0.8 millimeters on the seal ring 4. The seal ring 4 and the metal cap 5 have an external shape like square with rounded corners having a curvature radius approximately equal to a quatar of a side of the square of the metal cap 5. The straight sides and the rounded corners are smoothly united.

The seam welding is carried out by a combination of a rotation and a parallel motion of paired roller electrodes 6 in contact with the peripheral portion of the metal cap 5 along the seal ring 4 during which a voltage of 3 V to 4 V and pulse currents of approximately 200 mA are applied to the roller electrodes 6. The roller electrode 6 is moved with its rotation in contact with a peripheral edge of the metal cap 5 with application of a pulse current to the seal ring 4 and the metal cap 5. When the roller electrode 6 snows a straight movement along a straight side portion of the metal cap 5 and a rounding movement around a center axis of the metal cap 5 by a smaller angle than 90° along the rounded corner of the metal cap 5 for subsequent straight movement of the roller electrode 6 along another straight side of the metal cap 5.

Figure 4:
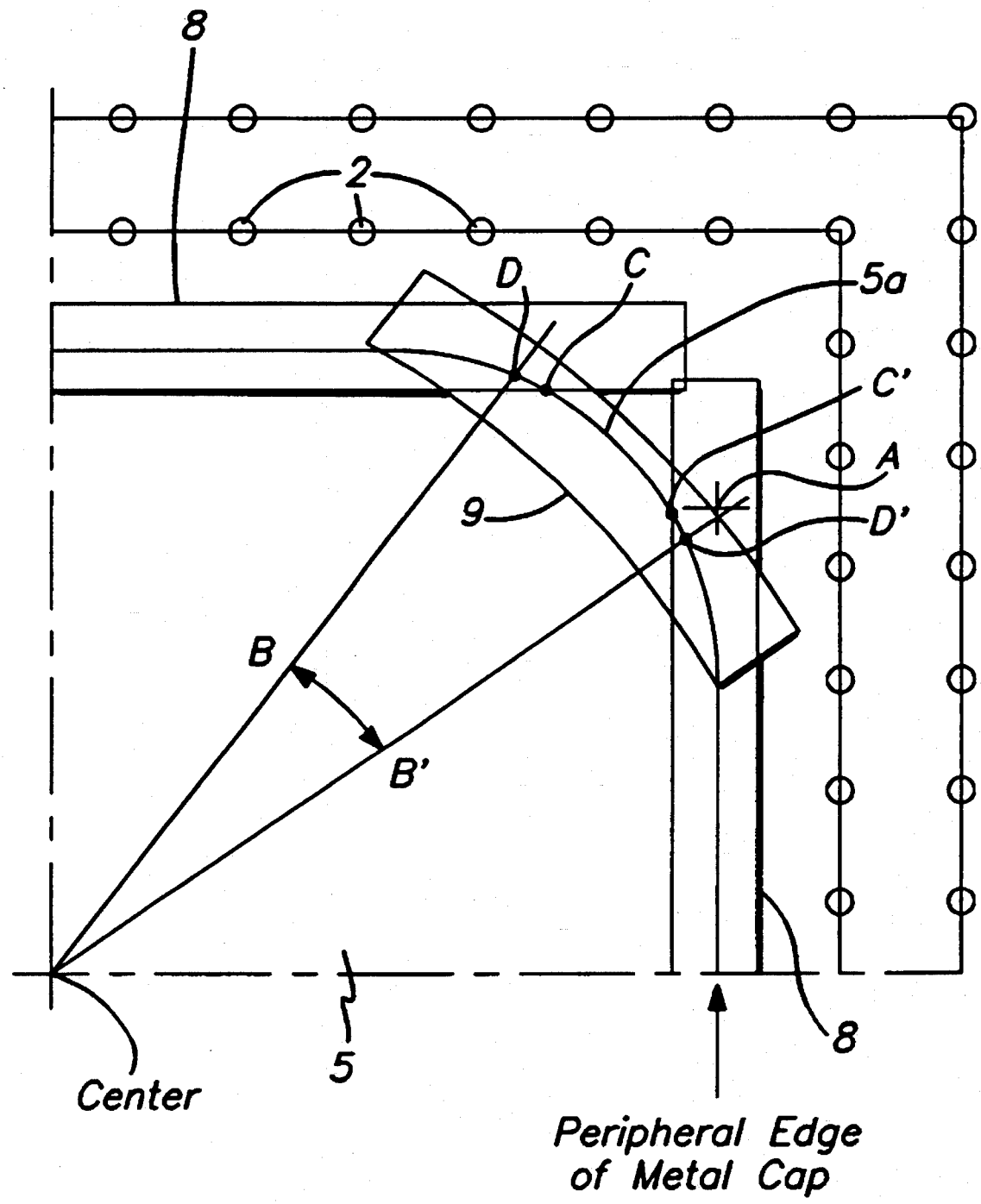
FIG. 4 is a fragmentary plane view illustrative of a metal cap with a novel definition involved in the cavity down mounting ceramic package according to the present invention.

In FIG. 4, straight vertical and horizontal areas 8 are subjected to a seam welding in the straight movement of the roller electrode 6, while an oblique area 9 is subjected to a seam welding in the rounding movement of the roller electrode 6 around the center axis of the metal cap 5. The rounded corner 5a outside a line C–C' and being adjacent to the straight side of the square metal cap is subjected to the seam welding in the straight movement of the roller electrode 6. The rounded corner 5a on a line D–D' is subjected to the seam welding in the rounding movement of the roller electrode 6 around the center axis of the metal cap 5. As a result, the rounded corner 5a on lines C–D and C–D' with a length of at least 0.5 millimeters is subjected to two times the seam welding in the rounding and straight movements of the roller electrode 6. According to the present invention, it is very important to make a possible reduction of an area of the roller electrode locus outside each corner of the metal cap 5. In view of obtaining a minimum area the roller electrode locus outside each corner of the metal cap 5, it is preferable that each the corner of the metal cap 5 has a curvature radium of approximately a quater of a length of the side of the square metal cap 5 and a width of the roller electrode 6 is limited to a minimum value in he necessary width for conducting the seam welding. In this preferred embodiment, the roller electrode 6 has a width of 2 millimeters and a radius of 6 millimeters. The metal cap 5 has 27.4 millimeters in a length of the each side of the square metal cap 5 and a curvature radius of the each corner of the metal cap 5 is 7.0 millimeters as well as a distance between the seal ring and the outer lead 2.58 millimeters.

The curvature radius of each the corner of the metal cap 5 is determined by considerations of the following two matters. In the straight movement of the roller electrode 6, the vertical roller electrode locus area 8 outside the point C is limited not to extend beyond the horizontal roller electrode locus area 8 outside the point C' to have any of the straight locus areas 8 to be spaced apart from the placement area for the outer leads 2 aligned in the form of matrix.

The novel metal cap shape may provide a larger placement area for a semiconductor device and a smaller dead zone area on which no outer lead is provided as illustrated in FIG. 5 as compared to the square and circular metal caps. When the outer leads are provided to have a distance of 2.58 millimeters from the seal ring at a pitch of 2.54 or 1.27 millimeters, then the square shape metal cap with the non-rounded corner eliminates 32 of outer leads or 48 of outer leads and 96 of the outer leads. When the length of the each side of the metal cap 5 is 27.4 millimeters, then it is permitted to mount the semiconductor device with a larger size of 20 millimeters than a size of 15 millimeters The materials of the seal ring 4 and the metal cap 5 may be Fe—Ni alloy. By contrast, the novel metal cap may completely be free from the above problem with the dead zone.

Whereas modifications of the present invention will no doubt be apparent to a person having ordinary skill in the art, to which the invention pertains, it is to be understood that the embodiments shown and described by way of illustrations are by no means intended to be considered in a limiting sense. Accordingly, it is to be intended to cover by claims all modifications of the invention which fall within the spirit and scope of the invention.

What is claimed is:

1. In a package for a semiconductor device comprising:

a package substrate having a cavity in which a semiconductor device is set;

a cap covering said cavity, said cap being in the shape of square with corners having a predetermined radius of curvature; and leads aligned in the form of a matrix around said cavity on said package substrate, each of said leads extending to stand upright at a predetermined density so that said cap is seam-welded with said package substrate by using a parallel seam welding method;

the improvement wherein said predetermined radius of curvature of said corners is about one quarter of the length of each side of said square, thereby to obtain a maximum increase in the number of said leads.

2. A package as claimed in claim 1, further comprising a sealing ring extending on said substrate about a peripheral part to the cavity, said sealing ring being in the shape of a square with corners having a radius of curvature of about one quarter of the length of each side of the last-mentioned said square, wherein said cap has a flat edge at its peripheral portion, said flat edge having the same shape as said sealing ring and wherein said peripheral part is formed with a metalized layer by which said sealing ring is brazed by Ag—Cu brass to the metalized layer.

3. A package as claimed in claim 2, wherein said sealing ring is made of Kovar plated with a metal selected from the group consisting of Ni and Au.

4. A package as claimed in claim 3, wherein said sealing ring has a thickness of 0.5 millimeters and a width of 1.0 millimeters.

5. A package as claimed in claim 2, wherein said flat edge has a width of 0.8 millimeters.

6. A package as claimed in claim 2, wherein said cap is made of Kovar clad with Ni.

\* \* \* \* \*